Figure 1:
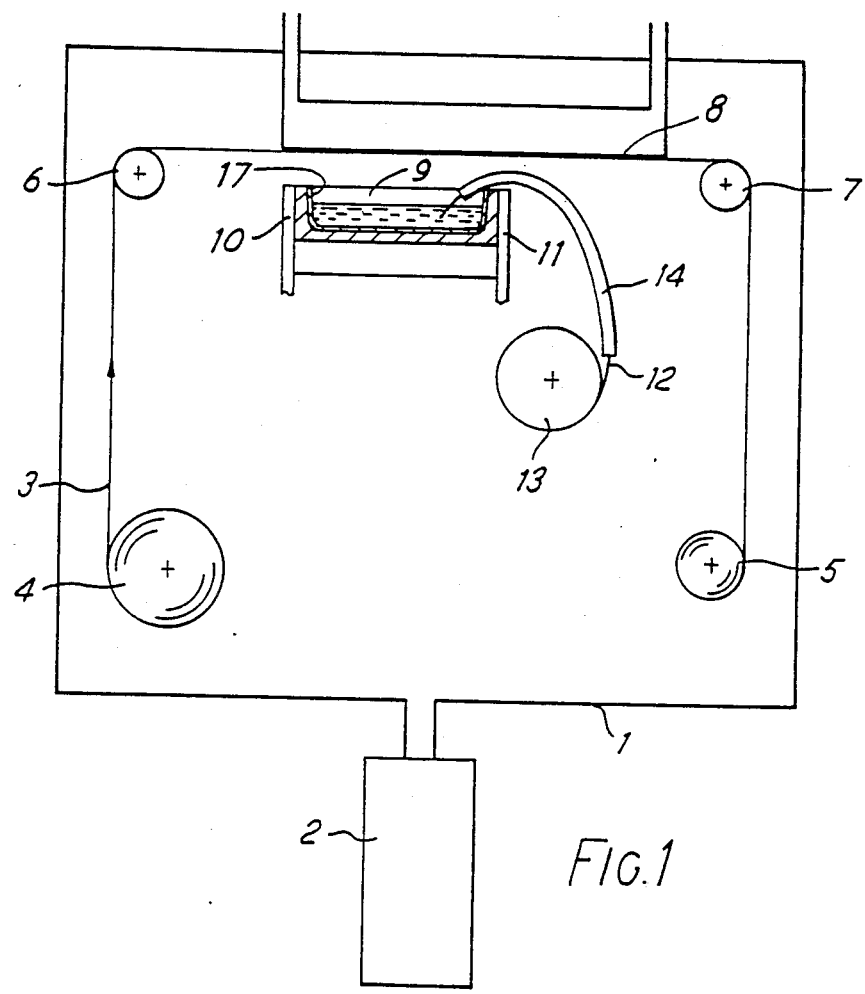

United States Patent [19]

Heyes

[11] Patent Number: 4,810,531
[45] Date of Patent: Mar. 7, 1989

[54] VAPOR DEPOSITION OF TIN
[75] Inventor: Peter J. Heyes, Wantage, England
[73] Assignee: Metal Box plc, Reading, England
[21] Appl. No.: 878,951
[22] PCT Filed: Oct. 10, 1985
[86] PCT No.: PCT/GB85/00454
 § 371 Date: Jun. 11, 1986
 § 102(e) Date: Jun. 11, 1986
[87] PCT Pub. No.: WO86/02387
 PCT Pub. Date: Apr. 24, 1986
[30] Foreign Application Priority Data
 Oct. 13, 1984 [GB] United Kingdom ............... 8425917
[51] Int. Cl.⁴ .............................................. C23C 16/00
[52] U.S. Cl. .................................... 427/236; 427/250; 427/251
[58] Field of Search .................... 427/250, 251, 236
[56] References Cited
 U.S. PATENT DOCUMENTS

| | | | |
|---|---|---|---|
| 2,860,075 | 11/1958 | Alexander et al. | 427/250 |
| 2,996,412 | 8/1961 | Alexander et al. | 427/250 |
| 3,205,086 | 9/1965 | Brick et al. | 427/251 |
| 3,227,132 | 1/1966 | Clough et al. | 427/251 |
| 3,457,784 | 7/1969 | Bolter | 427/251 |
| 3,649,734 | 3/1972 | Wilson | 13/31 |
| 3,730,507 | 5/1973 | Montgomery | 266/39 |

FOREIGN PATENT DOCUMENTS 740072 11/1955 United Kingdom .
1354702 11/1955 United Kingdom .

OTHER PUBLICATIONS

Archibald et al., "Source Evaporant Systems for Thermal Evaporation", *Solid State Technology*, vol. 19, No. 7, Jul., 1976, pp. 32–40.
*The Condensed Chemical Dictionary*, 6th ed., N.Y. Rheinhold, 1961, p. 1146.

*Primary Examiner*—Janice Bell
*Attorney, Agent, or Firm*—Diller, Ramik & Wight

[57] ABSTRACT

In the vapor deposition of tin on to a surface such as a polymeric film (3) to be used for packaging, a dispersion of titanium hydride (17) in a dispersant is applied to the interior surface of an evaporation boat (9) and the dispersant is evaporated before the boat is used to vaporize tin metal under vacuum for the purpose of metallizing the surface.

5 Claims, 1 Drawing Sheet

VAPOR DEPOSITION OF TIN

This invention relates to a method of vapour deposition of tin on to a surface, e.g. the surface of a film of plastics material to make a metallised film suitable for packaging.

In known methods of vapour deposition of metals, the metal is melted in a receptacle and evaporated therefrom and subsequently deposited from the vapour on to a surface to be coated. Conventional apparatus for metallising plastics film comprises a vacuum chamber containing a reel-to-reel transport mechanism which passes the film over one or more receptacles, known as evaporation "boats" or heaters. The boats are often made of boron nitride materials. The boats are heated by electric current while metal wire is fed into the boats from driven spools within the vacuum chamber.

Aluminium is commonly used for metallising packaging films. Aluminium is particularly suitable for vapour deposition because it has a relatively low melting point, favourable vapour pressure characteristics and acceptable cost. When molten, aluminium wets boron nitride completely and evaporates rapidly so that large areas of film can be coated quickly and processing costs are minimised.

However, there is a need for films bearing a vapour deposited coating of tin, because tin has the property of helping to preserve the colour and flavour of food products by preventing oxidative degeneration. Japanese patent publication No. 52 37170 describes various uses of tin coatings on organic film in containers for storing food and drink.

A polymeric film can be metallised with tin by using resistance heating to melt and evaporate the tin to create tin vapour. Although tin has favourable vapour pressure characteristics when molten, it unfortunately does not wet evaporation boats, particularly boron nitride boats, and consequently its evaporation rate is very low. The speed of transport of the film over the evaporation boats has therefore to be reduced so as to increase the residence time over the evaporation boats, to permit deposition of coating of useful thickness. This increased residence time over the evaporation boats gives rise to a risk of film damage as a result of excessive exposure to heat and to droplets of molten tin which may be thrown out of the boats. At such low speeds, the overhead costs of the apparatus become prohibitive to successful commercial working.

This invention provides a method of vapour deposition of tin on to a surface wherein the tin is melted in a receptacle and evaporated therefrom and subsequently deposited from the vapour on to the surface, characterised in that a coating of titanium hydride is applied to the receptacle before the tin is melted in it. This pretreatment of the receptacle results in its being wetted by the molten tin, so as to enhance the rate of evaporation of the tin and thereby permit economical deposition.

Preferably the coating is applied by applying to the receptacle a dispersion of titanium hydride in a volatile dispersant which does not react with the titanium hydride or the material of the receptacle, and then evaporating the dispersant.

The dispersant may be a chlorinated hydrocarbon, e.g. from the group consisting of carbon tetrachloride, 1,1,1-trichloroethane and dichloromethane.

The receptacle may be of an electrically conducting material, heated by passing an electrical current through it to melt the tin. For example, the receptacle may be of a boron nitride material.

The tin may be fed in the form of a wire into the heated receptacle.

Alternative boat materials include graphite and silicon carbide. The invention may be used to deposit tin on to a film of polymeric material, for example a film of polyethylene or polypropylene or a polyester.

Figure 2:
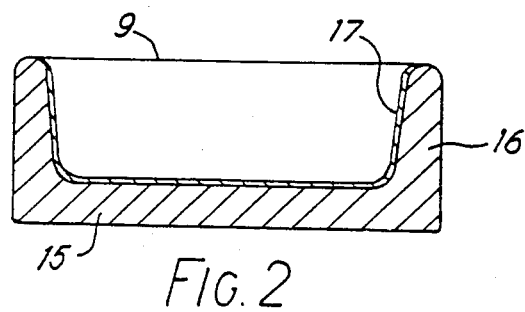

Various embodiments of the invention will now be described by way of example and with reference to the accompanying drawings, in which:

FIG. 1 is a diagrammatic representation of a side view of apparatus for vapour depositing a coating of metal on to a continuous web, and FIG. 2 is an enlarged view of an evaporation boat also seen in FIG. 1.

In FIG. 1 a vacuum chamber 1, evacuated by a vacuum pump 2 to a pressure of 1 to $8 \times 10^{-3}$ torr, contains a film 3 of polymeric material which is transported from a feed reel 4 to a receiving reel 5 via rolls 6,7 which hold a portion of the film against cooling plate 8 as the film passes over an array of heater receptacles or evaporation boats, of which only one, denoted 9, is shown. Each boat 9 is heated by passing an electric current through it from a first contact 10 to a second contact 11.

A tin metal wire 12 is delivered from a spool 13 via a guide tube 14 into the boat 9 where it melts and evaporates so that the vapour rises to condense on the cooled film 3.

FIG. 2 shows that the boat 9 has a bottom 15 and side walls 16 upstanding from the periphery of the bottom. The interior surfaces of the bottom and side walls of the boat are coated with titanium hydride 17.

The boat of FIGS. 1 and 2 was prepared by taking a boat of boron nitride material and applying to the interior surfaces of the boat a dispersion of titanium hydride in carbon tetrachloride. The carbon tetrachloride was then evaporated off to leave a coating of titanium hydride of a thickness of the order of 0.1 mm. on the interior surfaces of the boat.

With this pre-treatment of the boat, it was found that the boat was wetted by the molten tin and a high rate of evaporation was achieved, whereas without the coating the tin formed globules and evaporated only slowly. In cases where the boat had previously been used for evaporating aluminium, some partial wetting was observed but the tin evaporation rate was still inadequate.

The dispersion may be applied by filling the boat with dispersion and then pouring out the excess to leave a film retained by surface tension. Alternatively the dispersion may be applied by a brush or other applicator. Other chlorinated hydrocarbons which have been used successfully as dispersants are 1,1,1-trichloroethane and dichloromethane.

Further experiments were carried out with coatings of other materials besides titanium hydride, and with titanium hydride deposited from dispersions in other chlorinated hydrocarbon dispersants. The coating thickness was of the order of 0.1 mm. in each case. The contact angle between the molten tin and the boat surface was observed; where the tin wets the surface, the angle is zero but where it forms globules it is around or greater than 90°. A contact angle of substantially zero is necessary in order that the tin should present the maximum surface area for evaporation and that a high evaporation rate should be achievable. A tin wire of 1.6 mm. diameter was fed into the boat at a rate of 25 cm./min. and evaporation was continued for a maximum of 5 hours. An effective life of a boron nitride boat in aluminium metallising of about 5 hours is regarded as satisfactory and any shorter life raises process costs considerably. The results observed are set out in the following Table:

| Coatings on evaporation boat | Tin contact angle | Effective life |
| --- | --- | --- |
| Titanium carbide deposited from 1,1,1-trichloroethane | >90° | 0 |
| Zirconium hydride deposited from 1,1,1-trichloroethane | >90° | 0 |
| Calcium hydride deposited from 1,1,1-trichloroethane | >90° | 0 |
| Titanium disilicide deposited from 1,1,1-trichloroethane | ~0 | 1 to 1.3 hours |
| Titanium hydride deposited from 1,1,1-trichloroethane | 0 | >5 hours |
| Titanium hydride deposited from dichloromethane | 0 | >5 hours |

Further experiments were carried out with increased tin wire feed rates of 75, 100 and 115 cm./min., i.e. at higher evaporation rates, with the evaporation boats coated with titanium hydride and titanium disilicide. It was found that tin continued to evaporate satisfactorily from the titanium hydride coated boats. Titanium disilicide coated boats initially failed to wet completely at the highest wire feed rate of 115 cm./min. before onset of general de-wetting.

These results indicate that a titanium hydride coating of the evaporation receptacle or boat enables tin to be evaporated and deposited successfully at a high and economic rate for a satisfactorily long effective life of the boat, which could not be achieved with uncoated boats or with boats coated with other chemically similar materials. In particular, similar titanium compounds and hydrides of similar metals did not produce the results achieved with titanium hydride.

Whilst the invention has been described in terms of boron nitride boats, other boat materials may be used. For example, alternative boat materials include graphite or silicon carbide all of which will permit electrical resistance heating and adequate refractory performance to contain the molten metal.

Alternatively boats of non-conducting refractory material (such as alumina) may be used, in which case the metal is melted and evaporated by induction heat or other means.

Various dispersants may be used, but it is desirable that the dispersants should be non-inflammable and volatile so that they may be driven off safely. It will be understood by those in the art that the temperatures used to vaporise the metal can be as much as 1500° so that any risk of residual dispersant being driven off violently must be avoided.

I claim:

1. A method of vapour deposition of tin onto a surface comprising the steps of providing a receptacle of electrically conductive boron nitride material, applying to an inner surface of the boron nitride receptacle a dispersion of titanium hydride in a volatile dispersant which does not react with the titanium hydride or the boron nitride material of the receptacle, evaporating the dispersant leaving a coating consisting essentially only of titanium hydride upon the inner surface of the boron nitride receptacle, and thereafter melting tin in and evaporating tin from the titanium hydride coated boron nitride receptacle during subsequent vapour deposition of the tin onto the surface.

2. A method according to claim 1 characterised in that the dispersant is a chlorinated hydrocarbon.

3. A method according to claim 1 characterised in that the dispersant is selected from the group consisting of carbon tetrachloride, 1,1,1-trichloroethane and dichloromethane.

4. A method according to claim 1, characterised in that the receptacle is heated by passing an electrical current through it to melt the tin.

5. A method according to claim 1, characterised in that the tin is fed in the form of a wire into the heated receptacle.

* * * * *